United States Patent [19]

Kawamoto et al.

[11] Patent Number: 5,418,385
[45] Date of Patent: May 23, 1995

[54] SEMICONDUCTOR DEVICES USING POTENTIAL WELLS OR RESISTIVE ELEMENTS AS DELAY ELEMENTS AND APPARATUS FOR FORMING SUCH DEVICES

[75] Inventors: Hiroyuki Kawamoto; Hiroyuki Mori; Yoshio Inoue, all of Itami, Japan

[73] Assignee: Mitsubishi Denki Kabushiki Kaisha, Tokyo, Japan

[21] Appl. No.: 149,357

[22] Filed: Nov. 9, 1993

[30] Foreign Application Priority Data

Nov. 11, 1992 [JP] Japan .................. 4-300979

[51] Int. Cl.⁶ ........................... H01L 27/02
[52] U.S. Cl. ................... 257/208; 257/203; 257/364; 257/533; 257/538
[58] Field of Search ........... 257/533, 203, 208, 364, 257/537, 538

[56] References Cited

U.S. PATENT DOCUMENTS 4,516,312  5/1985  Tomita .................. 257/533

FOREIGN PATENT DOCUMENTS 58-141567  8/1983  Japan .................. 257/533
2-5459     1/1990  Japan .................. 257/533
2-78266    3/1990  Japan .................. 257/533

OTHER PUBLICATIONS

Market Requirements Specification, Futures in Clock Tree Synthesis, Cadence Confidential, Apr. 17, 1992, pp. 1–13.

Primary Examiner—Ngân V. Ngô
Attorney, Agent, or Firm—Lowe, Price, LeBlanc & Becker

[57] ABSTRACT

In a semiconductor device, a signal delay element is configured by using resistance and capacitance components included in a region except regions where logic elements for a gate array exist, and the signal delay element is inserted between a logic element for outputting signals and logic elements for receiving the signals and connected to these logic elements. A placing and wiring apparatus for producing the semiconductor device is disclosed.

9 Claims, 7 Drawing Sheets

SEMICONDUCTOR DEVICES USING POTENTIAL WELLS OR RESISTIVE ELEMENTS AS DELAY ELEMENTS AND APPARATUS FOR FORMING SUCH DEVICES

BACKGROUND OF THE INVENTION

1. Field of the Invention

The invention relates to a semiconductor device using a gate array, and also to a placing and wiring apparatus for placing and wiring logic elements so that a skew is not generated.

2. Description of the Related Art

Generally, a placing and wiring apparatus is employed to determine the placement of logic elements constituting the minimum unit of the placement and wiring, in a gate array having resistance and capacitance components, and then the layout of wirings for connecting the logic elements with each other.

Figure 1:
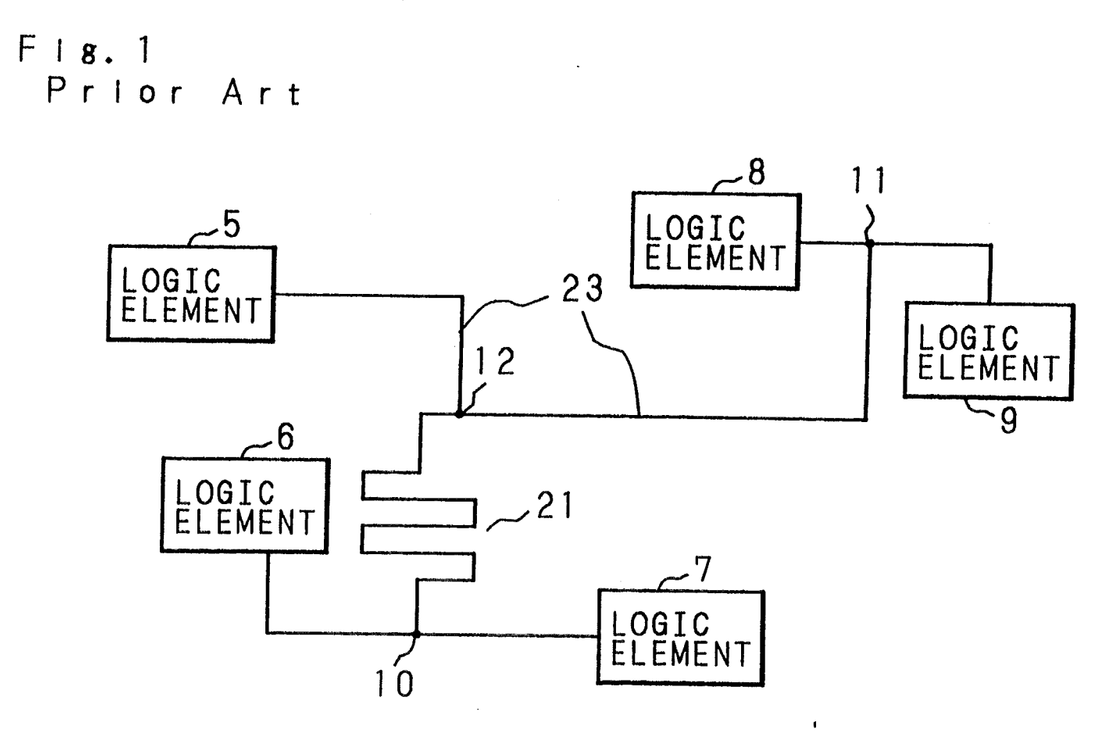
FIG. 1 is a diagram showing a circuit manufactured by a prior art placing and wiring apparatus.

FIG. 1 shows an example of circuits in which the placement and the layout of wirings have been conducted by such a placing and wiring apparatus. In the circuit shown in FIG. 1, 5 designates a logic element which outputs signals generated by the element itself, and logic elements 6, 7, 8 and 9 receive the signals from the logic element 5. The logic elements 5, 6, 7, 8 and 9 are interconnected by signal lines 23.

Each of the signal lines 23 constitutes a distributed constant circuit having a resistance component, capacitance component and a signal delay time which is uniquely determined by the resistance and the capacitance. When the resistance and/or the capacitance are increased, the signal delay time is lengthened. The resistance and capacitance of the signal line 23 which connects the logic element 5 with one of the logic elements 6, 7, 8 and 9 change in proportion to the length of the signal line, and therefore the signal delay time changes in accordance with the length of this signal line 23. When the signal lines 23 which respectively connect the logic element 5 with the logic elements 6, 7, 8 and 9 are different in length from each other, there occurs a phenomenon in which the signals from the logic element 5 are inputted to the logic elements 6, 7, 8 and 9 after the elapse of different signal delay times (hereinafter, such a phenomenon is referred to as "skew"), causing inconvenience to the whole of the circuit incorporating these logic elements. In order to prevent a skew from occurring, therefore, there has been taken measures against a skew in which the lengths of the signal lines 23 respectively connecting the logic element 5 with the logic elements 6, 7, 8 and 9 are made equal to each other.

Hereinafter, the measures will be described in detail. It is assumed that the logic elements 5, 6, 7, 8 and 9 are positionally fixed. In order to equalize the distance between the logic element 5 and the logic element 6 to that between the logic element 5 and the logic element 7, the middle point 10 of the signal line 23 connecting the logic element 6 with the logic element 7 is determined to be a junction point at which the signal line 23 from the logic element 5 is connected to the signal line 23 connecting the logic element 6 with the logic element 7. In order to equalize the distance between the logic element 5 and the logic element 8 to that between the logic element 5 and the logic element 9, the middle point 11 of the signal line 23 connecting the logic element 8 with the logic element 9 is determined to be a junction point at which the signal line 23 from the logic element 5 is connected to the signal line 23 connecting the logic element 8 with the logic element 9.

Then, in order to equalize the distance between the logic element 5 and the logic element 6 (or 7) to that between the logic element 5 and the logic element 8 (or 9), a junction point 12 is determined at which the signal line 23 from the logic element 5 is connected to the signal line 23 connecting the middle points 10 and 11 with each other. A case where a circuit(s) exists in the gate array in which the placement of the logic elements and the wiring are to be conducted, before the placement of the logic elements will be considered (hereinafter, such a circuit(s) is referred to as "master data"). When the master data and a signal line other than the signal lines 23 are located in the vicinity of the junction point 12 and the junction point 12 is determined to be on the location of the master data or the other signal line, the signal lines connected at the junction point 12 cause the master data or the other signal line to become invalid. Therefore, such a location of the middle point is inadequate for a junction point.

To comply with this, the location of the junction point 12 is determined in a manner other than that described above, namely, in the following manner. While the location of the junction point 12 is fixed, a signal line 21 which has a length equal to the difference between the length from the logic element 5 to the logic element 8 (or 9) and that from logic element 5 to the logic element 6 (or 7) is inserted between the middle point, 10 and the junction point 12, so that the distance between the logic element 5 and the logic element 6 (or 7) becomes equal to that between the logic element 5 and the logic element 8 (or 9). When the signal line 21 is long, it is formed in a meandering form as shown in FIG. 1. The signal line 21 having such a shape is called a meandering wiring.

In FIG. 1, it is assumed that the middle points 10 and 1 can be moved which are determined so that the distances between the logic element 5 and the logic elements 6, 7, 8 and 9 are equal to each other. In some cases, also the middle points 10 and 11 cannot be moved for the same reason as that with respect to the junction point 12. In such cases, the signal lines connected to the middle points 10 and 11 are formed as meandering wirings.

Figure 2:
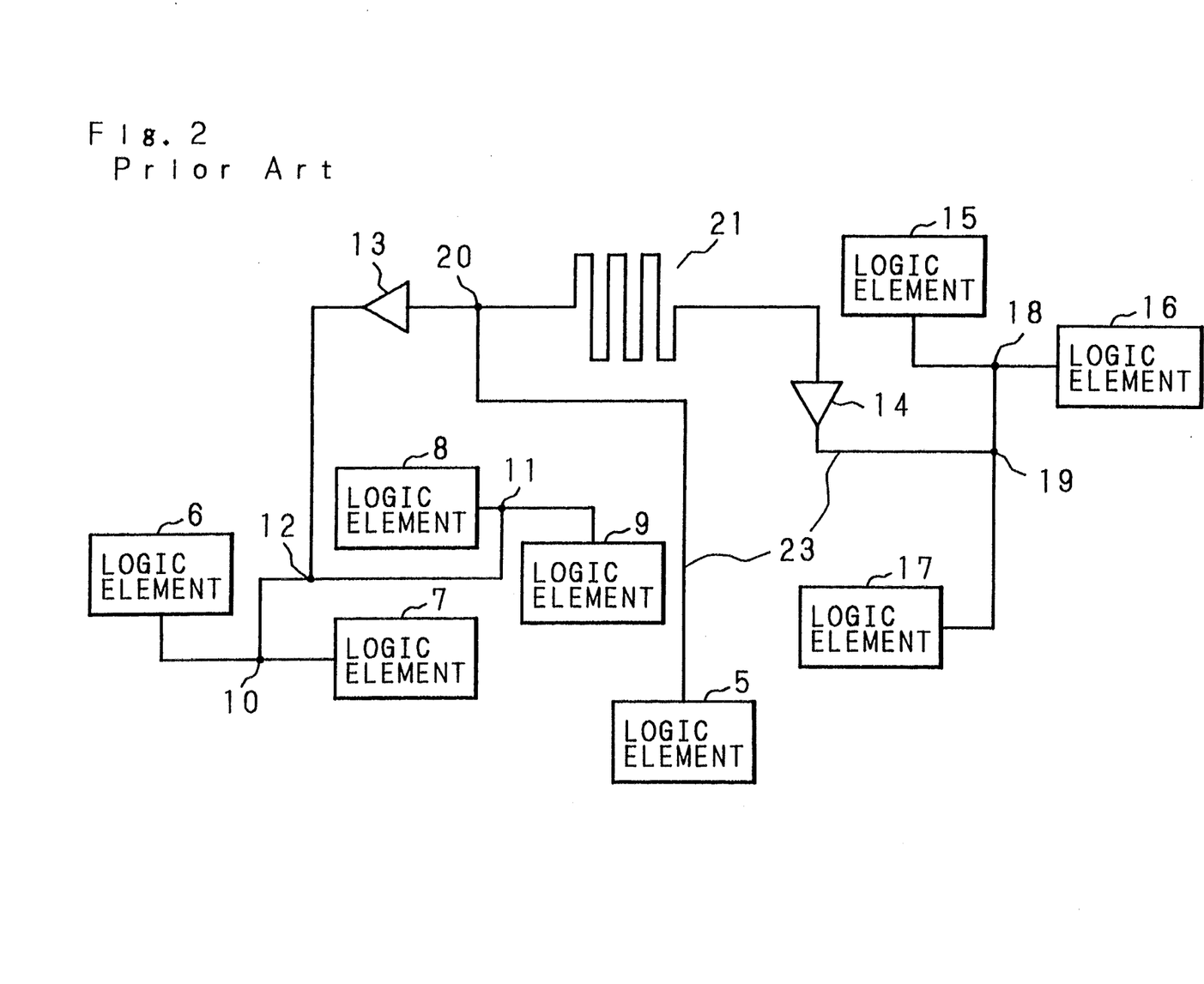
FIG. 2 is a diagram showing another circuit manufactured by a prior art placing and wiring apparatus.

FIG. 2 shows an example of circuits in which the placement and the layout of wirings have been conducted by a prior art placing and wiring apparatus so that a skew does not occur.

In the circuit shown in FIG. 2, the logic element 5 which outputs signals generated by the element itself is connected with a driver cell 13 and the meandering wiring 21 through the signal line 23 constituting the distributed constant circuit, and the driver cell 1.3 is connected with the logic elements 6, 7, 8 and 9 through the other signal lines 23. The meandering wiring 21 is connected with a driver cell 14 through another signal line 23, and the driver cell 14 is connected with logic elements 15, 16 and 17 through other signal lines 23. In the circuit, the logic element 5 must be connected with many logic elements. Accordingly, the driver cells 13 and 14 are disposed in order to drive the signals from the logic element 5 and transmit them to the logic elements 6, 7, 8, 9, 15, 16, 17 respectively.

Next, the measures for preventing a skew from occurring in the circuit of FIG. 2 will be described.

It is assumed that the placement of the logic elements 6, 7, 8, 9, 15, 16, 17 and that of the signal lines 23 are previously determined. In order that signals from the logic element 5 should be inputted to the logic elements 6 and 7 after the elapse of the same signal delay time, the middle point 10 of the signal line 23 connecting the logic elements 6 and 7 with each other is determined to be a junction point at which the signal line 23 from the logic element 5 is connected with the signal line 23 connecting the logic elements 6 and 7 with each other, so as to make the distance between the logic elements 5 and 6 equal to that between the logic elements 5 and 7. Then, in order that signals from the logic element 5 should be inputted to the logic elements 8 and 9 after the elapse of the same signal delay time, the middle point 11 of the signal line 23 connecting the logic elements 8 and 9 with each other is determined to be a junction point at which the signal line 23 from the logic element 5 is connected with the signal line 23 connecting the logic elements 8 and 9 with each other, so as to make the distance between the logic elements 5 and 8 equal to that between the logic elements 5 and 9.

A junction point 12 at which the signal line 23 from the logic element 5 is connected with the signal line 23 connecting the logic elements 6 (or 7) and 8 (or 9) with each other is determined so that signals from the logic element 5 are inputted to the logic elements 6 (or 7) and 8 (or 9) after the elapse of the same signal delay time, thereby making the distance between the logic elements 5 and 6 (or 7) equal to that between the logic elements 5 and 8 (or 9). In order that signals from the logic element 5 are inputted to the logic elements 15 and 16 after the elapse of the same signal delay time, the middle point 18 of the signal line 23 connecting the logic elements 15 and 16 is determined to be a junction point at which the signal line 23 from the logic element 5 is connected with the signal line 23 connecting the logic elements 15 and 16 with each other, so as to make the distance between the logic elements 5 and 15 equal to that between the logic elements 5 and 16.

A junction point 19 at which the signal line 23 from the logic element 5 is connected with the signal line 23 connecting the logic elements 15 (or 16) and 17 with each other is determined so that signals from the logic element 5 are inputted to the logic elements 15 (or 16) and 17 after the elapse of the same signal delay time, thereby making the distance between the logic elements 5 and 15 (or 16) equal to that between the logic elements 5 and 17. Then, a junction point 20 at which the signal line 23 from the logic element 5 is connected with the signal line 23 connecting the logic elements 6, 7, 8 and 9 with the logic elements 15, 16 and 17 is determined so that the signal delay time of the signal transmission from the logic element 5 to the logic elements 6, 7, 8 and 9 is equal to that of the signal transmission from the logic element 5 to the logic elements 15, 16 and 17. When a master data or another signal line is located in the vicinity of the junction point 20 and the junction point 20 cannot be moved the meandering wiring which has a length corresponding to the required difference in wiring length must be inserted between the junction point 20 and the driver cell 14 so as to make the signal delay time of the signal transmission from the logic element 5 to the logic elements 6, 7, 8 and 9 equal to that of the signal transmission From the logic element 5 to the logic elements 15, 16 and 17.

On the other hand, the signal delay times of the driver cells 13 and 14 are different from each other depending on their respective fan out. In order to determine the length of the meandering wiring 21, accordingly, it is necessary to consider the lengths of the signal lines 23 connecting the logic element 5 with the logic elements 6, 7, 8 and 9, the lengths of the signal lines 23 connecting the logic element 5 with the logic elements 15, 16 and 17, and the difference between the signal delay time of the driver cell 13 and that of the driver cell 14.

Since the difference in signal delay time between the driver cells 13 and 14 is short, the signal delay time cannot be adjusted by using the driver cells 13 and 14.

As described above, the meandering wiring 21 is used in a prior art placing and wiring apparatus. When the meandering wiring 21 is long, a wide region is assigned to the meandering wiring. This prohibits transistors existing in the meandering wiring region from being used as logic elements, thereby producing a problem in that the ratio of the number of available logic elements to the number of all transistors is lowered (hereinafter, the ratio is referred to as "gate available ratio").

SUMMARY OF THE INVENTION

It is an object of the invention to provide a semiconductor device which is provided with a signal delay element consisting of resistance and capacitance components that are included in a region except regions where logic elements exist, thereby improving the gate available ratio.

It is another object of the invention to provide a placing and wiring apparatus which, in place of a meandering wiring, forms a signal delay element having resistance and capacitance components that are included in a region except regions where logic elements exist, and connects the signal delay element with the logic elements, thereby improving the gate available ratio.

The semiconductor device of the invention comprises a signal delay element which is in a region except regions where logic elements formed in a gate array having resistance and capacitance components exist, and which is connected with the logic elements. The signal delay element is configured by using resistance and capacitance components included in the region except the regions where the produced logic elements exist. Therefore, the signal delay element is configured by using resistance and capacitance components included in the region except the regions where the logic elements which are formed in a predetermined region of the gate array exist. This allows transistors in the region to be used as the signal delay element, thereby improving the gate available ratio.

The placing and wiring apparatus of the invention is an apparatus which places logic elements in a predetermined region of a gate array having resistance and capacitance components, and a signal delay element in a region except regions where the logic elements are placed, and which conducts a wiring between said signal delay element and the logic elements. The placing and wiring apparatus has means for forming the signal delay element by using resistance and capacitance components included in the region except the regions where the logic elements are placed, and means for conducting a wiring between the formed signal delay element and the logic elements. Therefore, the signal delay element is formed, in place of a meandering wiring, by using resistance and capacitance components included in the region except the regions where the logic elements which are formed in the predetermined region of the gate array exist, and the formed signal delay element is connected with the logic elements. Accordingly, the gate available ratio can be improved.

The above and further objects and features of the invention will more fully be apparent from the following detailed description with accompanying drawings.

DESCRIPTION OF THE PREFERRED EMBODIMENTS

Hereinafter, the invention will be described in detail with reference to the drawings showing embodiments of the invention.

Figure 3A:
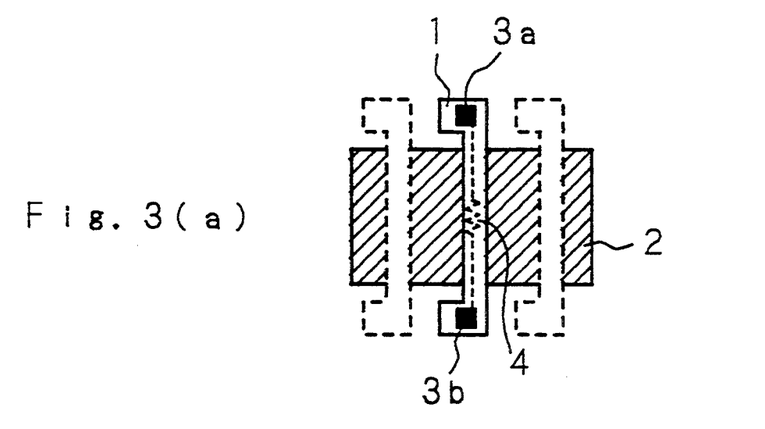
FIGS. 3(a) and (b) are schematic plan views of signal delay elements constructed according to the invention.
Figure 3B:
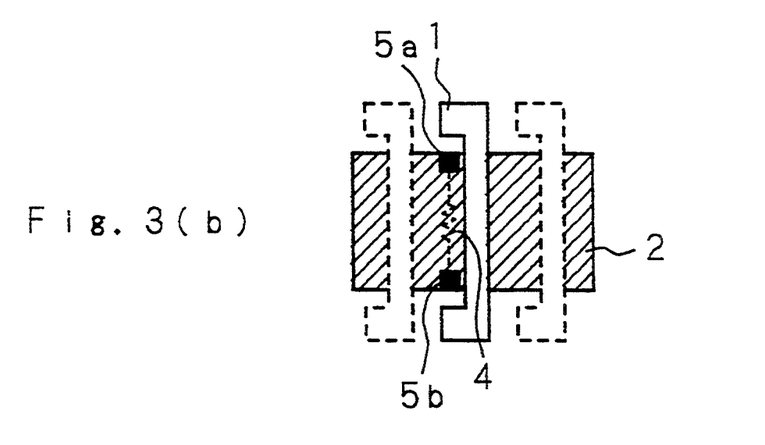

FIGS. 3(a) and (b) are schematic plan views showing signal delay elements which use a resistance component and capacitance component (not shown) of a transistor area in a region except regions having logic elements formed in a gate array (hereinafter, such a signal delay element is referred to as "resistance logic element"). In FIG. 3(a), 1 designates a polysilicon gate which passes over an N-channel or P-channel 2. Connecting terminals 3a and 3b which are to be connected with other elements (not shown) are formed at the ends of the polysilicon gate 1, respectively. Between the connecting terminals 3a and 3b, there exist a resistance component and a capacitance component (not shown).

In FIG. 3(b), the polysilicon gate 1 passes over a well 2 which is similar to the well 2 of FIG. 3(a), and connecting terminals 5a and 5b which are to be connected with other elements (not shown) are formed at the ends of the well 2, respectively. Between the connecting terminals 5a and 5b, there exist a resistance logic element 4 which has a resistance component and a capacitance component (not shown).

In the resistance logic element of FIG. 3(a), the polysilicon gate 1 functions as a signal delay element having the resistance component and the unshown capacitance component, and, in the resistance logic element of FIG. 3(b), the well 2 functions as a signal delay element having the resistance component and the unshown capacitance component. Since a large number of such polysilicon gates 1 and/or wells 2 exist in a resistance logic element 4, it is possible to use several of them to constitute the resistance logic element 4 having a required signal delay time.

Figure 4:
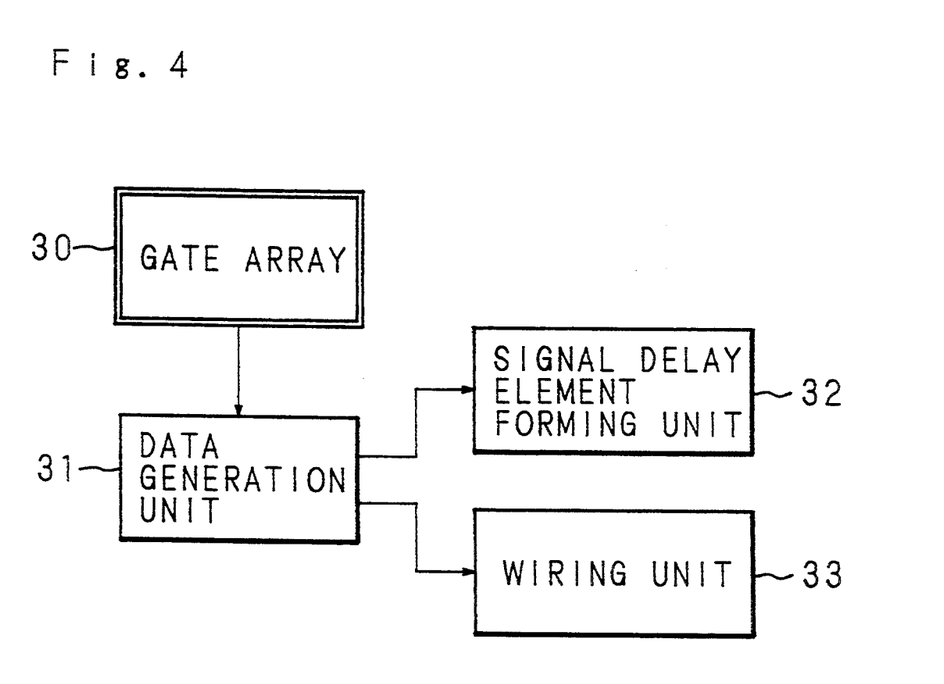
FIG. 4 is a block diagram showing the configuration of the placing and wiring apparatus of the invention.

FIG. 4 is a block diagram schematically showing the configuration of the placing and wiring apparatus of the invention. In the figure, 30 designates a gate array wherein a plurality of logic elements are formed, and 31 designates a data generation unit for obtaining formation data and wiring data for a resistance logic element to be configured. The data generation unit 31 outputs obtained formation data and wiring data to a signal delay element forming unit 32 and a wiring unit 33, respectively. In accordance with the formation data, the signal delay element forming unit 32 produces the resistance logic element 4 (signal delay element) as shown in FIGS. 3(a) and (b) described above. In accordance with the wiring data, the wiring unit 33 conducts the wiring connecting the formed resistance logic element 4 with predetermined logic elements.

Figure 5:
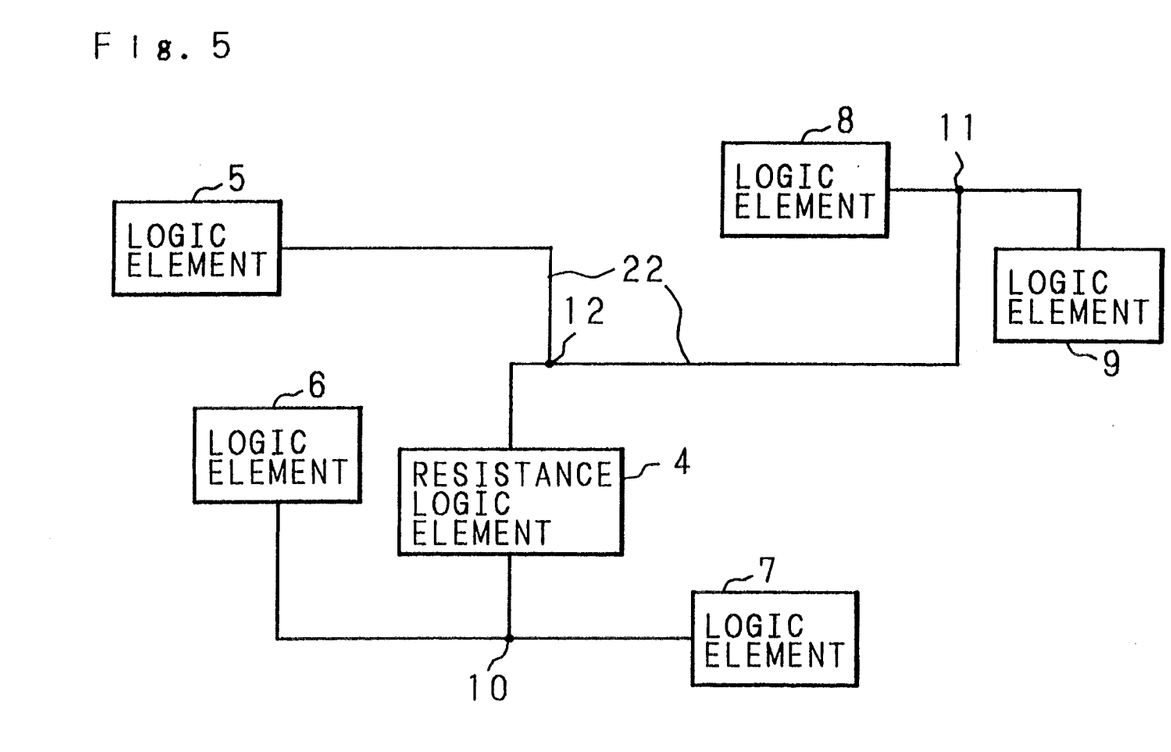
FIG. 5 is a diagram showing a first embodiment of a circuit manufactured by the placing and wiring apparatus of the invention.

FIG. 5 shows the first embodiment of a circuit manufactured by the placing and wiring apparatus of the invention. In FIG. 5, a logic element 5 which outputs generated signals is connected with logic elements 8 and 9 through a signal line 22 which has resistance and capacitance components and constitutes a distributed constant circuit. The logic element 5 is further connected with logic elements 6 and 7 through the signal line 22 and the resistance logic element 4 which is a signal delay element. The placing and wiring apparatus of the invention conducts the wilting of the logic elements in the procedure described below.

In order that signals from the logic element 5 should be inputted to the logic elements 6 and 7 after the elapse of the same signal delay time, the middle point 10 of the signal line 22 connecting the logic elements 6 and 7 with each other is determined to be a junction point at which the signal line 22 from the logic element 5 is connected with the signal line 22 connecting the logic elements 6 and 7 with each other, so as to make the distance between the logic elements 5 and 6 equal to that between the logic elements 5 and 7. Then, in order that signals from the logic element 5 should be inputed to the logic elements 8 and 9 after the elapse of the same signal delay time, a middle point 11 of the signal line 22 connecting logic elements 8 and 9 with each other is determined to be a junction point at which the signal line 22 from the logic element 5 is connected with the signal line 22 connecting the logic elements 8 and 9 with each other, so as to make the distance between the logic elements 5 and 8 equal to that between the logic elements 5 and 9.

It is assumed that a master data or another signal line exists in the vicinity of a junction point 12 at which the signal line 22 from the logic element 5 is connected with the signal line 22 connecting the logic element 6 (or 7) with the logic element 8 (or 9) and therefore it is impossible to move the position of the junction point 12, and that the signal delay time of the signal transmission from the logic element 5 to the logic elements 8 and 9 is longer than that of the signal transmission from the logic element 5 to the logic elements 6 and 7. The resistance logic element 4 is inserted between the junction point 12 and the middle point 10. The resistance and capacitance of the resistance logic element 4 are determined so that the signal delay time of the signal transmission from the logic element 5 to the logic elements 6 and 7 becomes equal to that of the signal transmission from the logic element 5 to the logic elements 8 and 9. The resistance logic element 4 uses the resistance and capacitance components of the region in the vicinity of the signal line 22 connecting the junction point 12 with the middle point 10.

Figure 6:
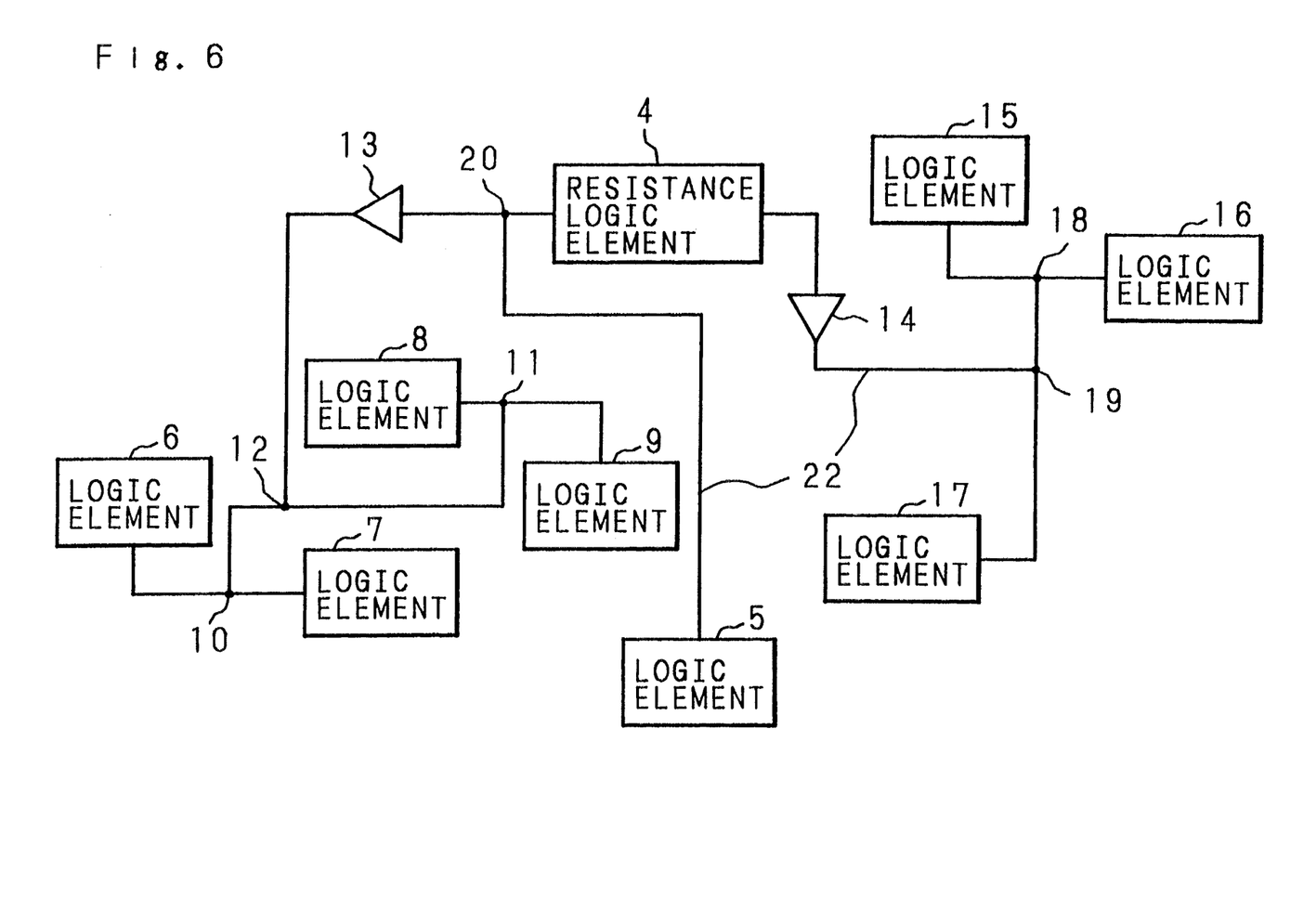
FIG. 6 is a diagram showing a second embodiment of a circuit manufactured by the placing and wiring apparatus of the invention.

FIG. 6 shows the second embodiment of a circuit manufactured by the placing and wiring apparatus of the invention. In FIG. 6, a logic element 5 which outputs generated signals is connected with a driver cell 13 and the resistance logic element 4 through the signal line 22 which has resistance and capacitance components and constitutes a distributed constant circuit. The driver cell 13 is connected with the logic elements 6, 7, 8 and 9 through the signal lines 22, and the resistance logic element 4 is connected with logic elements 15, 16 and 17 through a driver cell 14 and the signal lines 22. The placing and wiring apparatus of the invention conducts the wiring of the logic elements in the following procedure.

In order that signals from the logic element 5 should be inputted to the logic elements 6 and 7 after the elapse of the same signal delay time, the middle point 10 of the signal line 22 connecting the logic elements 6 and 7 with each other is determined to be a junction point at which the signal line 22 from the logic element 5 is connected with the signal line 22 connecting the logic elements 6 and 7 with each other, so as to make the distance between the logic elements 5 and 6 equal to that between the logic elements 5 and 7. Then, in order that signals from the logic element 5 should be inputted to the logic elements 8 and 9 after the elapse of the same signal delay time, the middle point 11 of the signal line 22 connecting the logic elements 8 and 9 with each other is determined to be a junction point at which the signal line 22 from the logic element 5 is connected with the signal line 22 connecting the logic elements 8 and 9 with each other, so as to make the distance between the logic elements 5 and 8 equal to that between the logic elements 5 and 9.

In order that signals from the logic element 5 should be inputted to the logic elements 6 (or 7) and 8 (or 9) after the elapse of the same signal delay time, the junction point 12 is determined at which the signal line 22 from the logic element 5 is connected to the signal line 22 connecting the logic element 6 (or 7) with the logic element 8 (or 9), so as to equalize the distance between the logic element 5 and the logic element 6 (or 7) to that between the logic element 5 and the logic element 8 (or 9).

In order that signals from the logic element 5 should be inputted to the logic elements 15 and 16 after the elapse of the same signal delay time, a middle point 18 of the signal line 22 connecting the logic elements 15 and 16 with each other is determined to be a junction point at which the signal line 22 from the logic element 5 is connected with the signal line 22 connecting the logic elements 15 and 16 with each other, so as to make the distance between the logic elements 5 and 15 equal to that between the logic elements 5 and 16. In order that signals from the logic element 5 should be inputted to the logic elements 15 (or 16) and 17 after the elapse of the same signal delay time, a junction point 19 is determined at which the signal line 22 from the logic element 5 is connected to the signal line 22 connecting the logic element 15 (or 16) with the logic element 17, so as to equalize the distance between the logic element 5 and the logic element 15 (or 16) to that between the logic element 5 and the logic element 17.

It is assumed that a master data or another signal line exists in the vicinity of a junction point 20 at which the signal line 22 from the logic element 5 is connected with the signal line 22 connecting the logic elements 6, 7, 8 and 9 with the logic elements 15, 16 and 17. In this case, it is impossible to move the position of the junction point 20. When the signal delay time of the signal transmission from the logic element 5 to the logic elements 6, 7, 8 and 9 is longer than that of the signal transmission from the logic element 5 to the logic elements 15, 16 and 17, the resistance logic element 4 is inserted between the junction point 20 and the junction point 19. Considering the difference between the signal delay time of the driver cell 13 and that of the driver cell 14, the resistance and capacitance of the resistance logic element 4 are determined.

Figure 7:
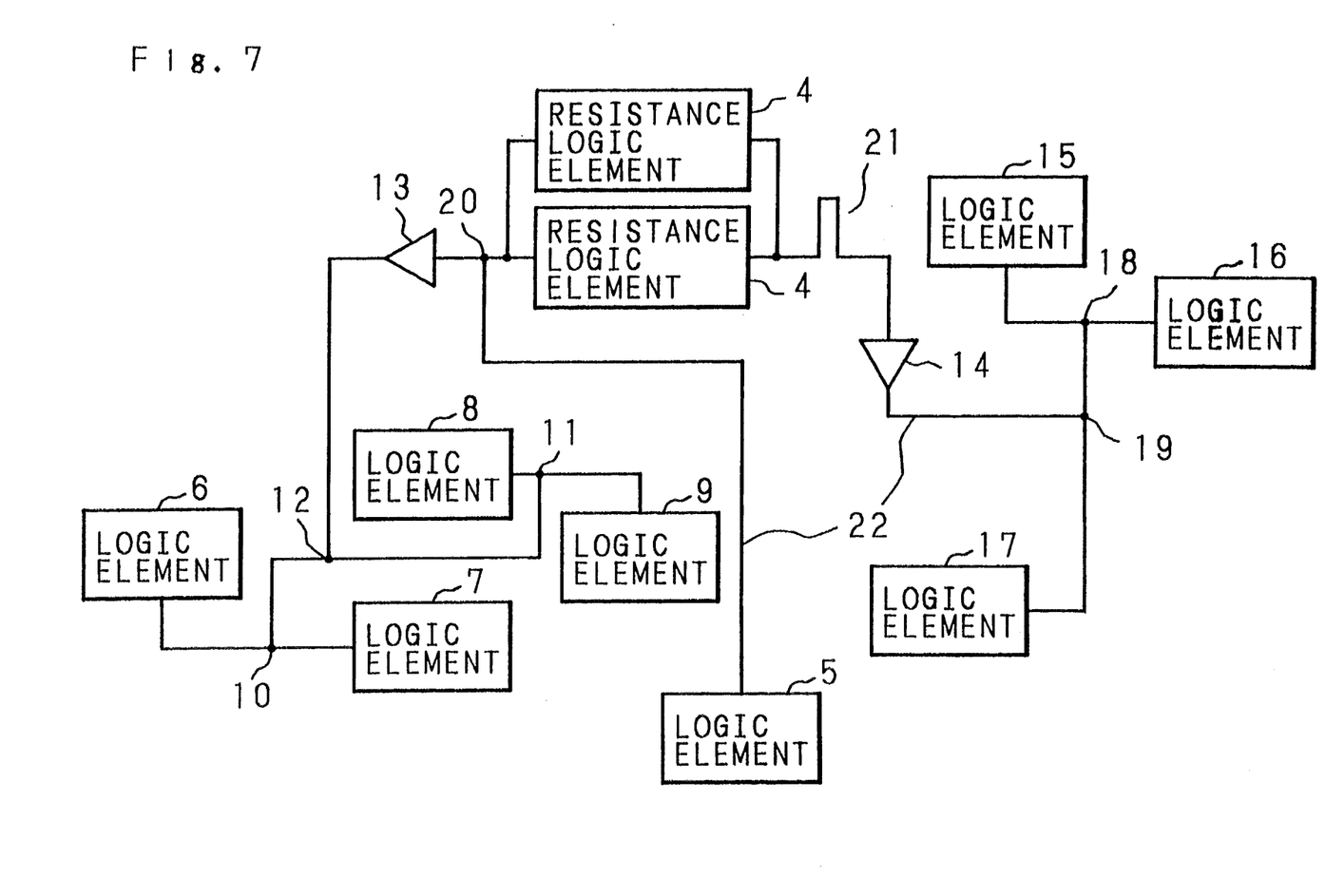
FIG. 7 is a diagram showing a third embodiment of a circuit manufactured by the placing and wiring apparatus of the invention.

FIG. 7 is a circuit diagram of the third embodiment showing a result obtained by determining in a more correct manner (hereinafter, this determination is referred to as "tuning") the resistance and capacitance of the resistance logic element 4 which have been determined in the second embodiment shown in FIG. 6.

In FIG. 7, the resistance logic elements 4, 4 and a meandering wiring 21 are inserted between the junction point 20 and the driver cell 14. Except this point, the configuration of the embodiment is the same as that of FIG. 6. Therefore, the corresponding portions are designated by the same reference numerals and their description is omitted. Next, the procedure of the tuning according to the placing and wiring apparatus of the invention will be described.

In the second embodiment of FIG. 6, the resistance logic element 4 which is used as the signal delay element is configured by polysilicon gates 1 or wells 2 having a fixed resistance and capacitance, and therefore it is difficult to obtain a correct resistance and capacitance by using the resistance logic element 4 thus configured. Accordingly, there may arise a case where, in spite of the provision of the resistance logic element 4, the signal delay time of the signal transmission from the logic element 5 to the logic elements 6, 7, 8 and 9 is not equal to that of the signal transmission from the logic element to the logic elements 15, 16 and 17.

In such a case, a tuning will be conducted in the following manner. While the resistance logic element 4 remains to be inserted, the difference between the signal delay time of the signal transmission from the logic element 5 to the logic elements 6, 7, 8 and 9 and that of the signal transmission from the logic element 5 to the logic elements 15, 16 and 17 is obtained again. From the obtained difference of signal delay time, calculated are the differences between the resistance and capacitance of the line from the logic element 5 to the logic elements 6, 7, 8 and 9, and those of the line from the logic element 5 to the logic elements 15, 16 and 17. A plurality of resistance logic elements 4 are inserted between the junction points 19 and 20 so that the differences of resistance and capacitance become zero. In other words, a plurality of resistance logic elements 4 are connected in series or in parallel so as to obtain a predetermined resistance and capacitance, thereby completing the tuning.

When, in spite of the above tuning, it remains difficult to equalize the signal delay time of the signal transmission from the logic element 5 to the logic elements 6, 7, 8 and 9 to that of the signal transmission from the logic element 5 to the logic elements 15, 16 and 17, a further procedure will be taken as follows. The meandering wiring 21 is inserted between the junction points 19 and 20. The length of the meandering wiring 21 is adjusted so that the signal delay time of the signal transmission from the logic element 5 to the logic elements 6, 7, 8 and 9 becomes equal to that of the signal transmission from the logic element 5 to the logic elements 15, 16 and 17. As a result, the signal delay time of the signal transmission from the logic element 5 to the logic elements 6, 7, 8 and 9 is made equal to that of the signal transmission from the logic element 5 to the logic elements 15, 16 and 17.

As described above, in the semiconductor device of the invention, resistance and capacitance components of a region except regions having logic elements for a gate array are used as a signal delay element. Therefore, the gate available ratio is improved.

According to the placing and wiring apparatus of the invention, in place of a meandering wiring, a signal delay element which is formed by using resistance and capacitance components of a region except regions having logic elements for a gate array is connected with logic elements. Therefore, the gate available ratio can be improved.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A semiconductor device comprising:
   a plurality of logic elements which require connection into a common signal point with equalized delays,
   at least one semiconductor region comprising at least one of a gate region and a potential well region in the path between one logic element and said signal point for adjusting the delay to a value substantially equal to that of at least one other logic element,
   whereby the connections of at least two paths to said signal point have equal delays.

2. A semiconductor device according to claim 1, wherein said at least one semiconductor region consists of at least one polysilicon gate.

3. A semiconductor device according to claim 1, wherein said at least one semiconductor region consists of at least one potential well of one conductivity type.

4. An improved placing and wiring apparatus which positions logic elements at predetermined positions in a gate array having resistance and capacitance components, and a signal delay element in a region other than regions where said logic elements are placed, and which routes wiring between said signal delay element and said logic elements, said apparatus comprising:
   forming means for forming said signal delay element by using resistance and capacitance components included in said region except said regions where said logic elements are placed;
   wiring between said signal delay element formed by said forming means and said logic elements; and
   at least one of a gate region and potential well region for adjusting the delay of a particular wiring interconnection path within the wiring to a particular value.

5. A placing and wiring apparatus according to claim 4, wherein said logic elements include at least one signal output logic element and a plurality of signal input logic elements, and said signal delay element is connected with said signal output logic element and at least one of said signal input logic elements.

6. A placing and wiring apparatus according to claim 5, wherein said forming means forms a signal delay element having a resistance and capacitance which are set so that signal delay times of signal transmissions from said signal output logic element to said signal input logic elements are equal to each other.

7. A placing and wiring apparatus according to claim 5, further comprising:
   means for, in a state where said signal delay element remains to be inserted, measuring signal delay times of signal transmissions from said signal output logic element to said signal input logic elements; and
   means for sending placement data and wiring data for a signal delay element to be configured to said forming means and said wiring means, so that when the signal delay element is formed the measured signal delay times become equal to each other.

8. A placing and wiring apparatus according to claim 7, further comprising
   means for forming a meandering wiring, when the measured signal delay times cannot be made equal to each other only by the formation of the signal delay element.

9. A placing and wiring apparatus according to claim 7, in which the signal delay element comprises series or parallel combinations of elementary delay elements.

* * * * *